United States Patent
Lin et al.

(10) Patent No.: US 12,027,470 B2
(45) Date of Patent: Jul. 2, 2024

(54) PACKAGE CARRIER HAVING A STIFFENER BETWEEN SOLDER BUMPS

(71) Applicant: Industrial Technology Research Institute, Hsinchu (TW)

(72) Inventors: Yu-Min Lin, Hsinchu County (TW); Ching-Kuan Lee, Hsinchu County (TW); Chao-Jung Chen, Hsinchu County (TW); Ren-Shin Cheng, Tainan (TW); Ang-Ying Lin, Tainan (TW); Po-Chih Chang, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 406 days.

(21) Appl. No.: 17/547,200

(22) Filed: Dec. 9, 2021

(65) Prior Publication Data
US 2022/0367385 A1 Nov. 17, 2022

Related U.S. Application Data

(60) Provisional application No. 63/186,810, filed on May 11, 2021.

(30) Foreign Application Priority Data

Oct. 18, 2021 (TW) .................................. 110138515

(51) Int. Cl.
*H01L 21/48* (2006.01)
*H01L 21/56* (2006.01)
(Continued)

(52) U.S. Cl.
CPC .......... *H01L 23/562* (2013.01); *H01L 21/481* (2013.01); *H01L 21/4846* (2013.01);
(Continued)

(58) Field of Classification Search
CPC ... H01L 23/3128; H01L 23/562; H01L 23/15; H01L 23/3121; H01L 23/49822;
(Continued)

(56) References Cited

U.S. PATENT DOCUMENTS 8,946,564 B2  2/2015  Hu et al.
9,478,472 B2  10/2016  Hu
(Continued)

FOREIGN PATENT DOCUMENTS

CN  110517993  11/2019
CN  112038329  12/2020
(Continued)

*Primary Examiner* — Alonzo Chambliss
(74) *Attorney, Agent, or Firm* — JCIPRNET

(57) ABSTRACT

A package carrier, including a first redistribution structure layer, multiple conductive connecting members, a connection structure layer, at least one stiffener, and a molding compound, is provided. The conductive connecting members are disposed on a first surface of the first redistribution structure layer and are electrically connected to the first redistribution structure layer. The connection structure layer is disposed on a second surface of the first redistribution structure layer and includes a substrate and multiple pads. A top surface and a bottom surface of each pad are respectively exposed to an upper surface and a lower surface of the substrate. The pads are electrically connected to the first redistribution structure layer. The stiffener is disposed on the first surface and is located at least between the conductive connecting members. The molding compound is disposed on the first surface and covers the conductive connecting members and the stiffener.

20 Claims, 17 Drawing Sheets

(51) Int. Cl.
*H01L 23/00* (2006.01)
*H01L 23/15* (2006.01)
*H01L 23/31* (2006.01)
*H01L 23/498* (2006.01)

(52) U.S. Cl.
CPC .......... *H01L 21/4857* (2013.01); *H01L 21/56* (2013.01); *H01L 21/568* (2013.01); *H01L 23/15* (2013.01); *H01L 23/3107* (2013.01); *H01L 23/3121* (2013.01); *H01L 23/3128* (2013.01); *H01L 23/49816* (2013.01); *H01L 23/49822* (2013.01); *H01L 23/49827* (2013.01); *H01L 23/49833* (2013.01); *H01L 23/49838* (2013.01); *H01L 24/14* (2013.01); *H01L 24/17* (2013.01)

(58) Field of Classification Search
CPC ......... H01L 23/49827; H01L 23/49833; H01L 23/49838; H01L 23/49816; H01L 23/3107; H01L 21/481; H01L 21/4857; H01L 21/568; H01L 21/56; H01L 21/4846; H01L 24/14; H01L 24/17
See application file for complete search history.

(56) References Cited

U.S. PATENT DOCUMENTS

| | | |
|---|---|---|
| 9,502,322 B2 | 11/2016 | Hu |
| 10,290,609 B2 | 5/2019 | Lin et al. |
| 10,475,752 B2 | 11/2019 | Hsu et al. |
| 11,362,010 B2* | 6/2022 | Lin .......... H01L 23/16 |
| 11,450,622 B2* | 9/2022 | Wang ............ H01L 23/3677 |
| 11,569,156 B2* | 1/2023 | Huang ............ H01L 23/5385 |
| 2011/0127657 A1* | 6/2011 | Oda ............ H01L 21/6835 |
| | | 257/E23.056 |
| 2021/0118757 A1* | 4/2021 | Lin .......... H01L 21/56 |

FOREIGN PATENT DOCUMENTS

| | | |
|---|---|---|
| CN | 112687549 | 4/2021 |
| TW | I499023 | 9/2015 |
| TW | 201826418 | 7/2018 |
| TW | 201839931 | 11/2018 |
| TW | I657551 | 4/2019 |
| TW | 202117869 | 5/2021 |

* cited by examiner

PACKAGE CARRIER HAVING A STIFFENER BETWEEN SOLDER BUMPS

CROSS-REFERENCE TO RELATED APPLICATION

This application claims the priority benefit of U.S. Provisional Application No. 63/186,810, filed on May 11, 2021 and Taiwan Application No. 110138515, filed on Oct. 18, 2021. The entirety of each of the above-mentioned patent applications is hereby incorporated by reference herein and made a part of this specification.

BACKGROUND

Technical Field

The disclosure relates to a package carrier and a manufacturing method thereof and a chip package structure adopting the package carrier.

Description of Related Art

In the prior art, since two-and-a-half-dimensional integrated circuit (2.5D IC) stacking requires the use of a silicon interposer, the packaging cost remains high. In order to effectively reduce the packaging cost, an organic interposer is currently used to replace the silicon interposer. However, during the process of assembling the organic interposer, the assembly surface is often heated and warped, which causes the surface coplanarity of a carrier to be poor, such that a chip cannot be smoothly assembled onto the carrier.

SUMMARY

The package carrier of the disclosure includes a first redistribution structure layer, multiple conductive connecting members, a connection structure layer, at least one stiffener, and a molding compound. The first redistribution structure layer has a first surface and a second surface opposite to each other. The conductive connecting members are disposed on the first surface of the first redistribution structure layer and are electrically connected to the first redistribution structure layer. The connection structure layer is disposed on the second surface of the first redistribution structure layer. The connection structure layer includes a substrate and multiple pads. A top surface and a bottom surface of each pad are respectively exposed to an upper surface and a lower surface of the substrate. The pads are electrically connected to the first redistribution structure layer. The stiffener is disposed on the first surface of the first redistribution structure layer and is located at least between the conductive connecting members. The molding compound is disposed on the first surface of the first redistribution structure layer and covers the conductive connecting members and the stiffener.

The manufacturing method of the package carrier of the disclosure includes the following steps. A substrate and multiple conductive bars are provided. The conductive bars are embedded in the substrate, and an end of each conductive bar is exposed to a side of the substrate. A first redistribution structure layer is formed on the side of the substrate. Multiple conductive connecting members and at least one stiffener are formed on the first redistribution structure layer. The stiffener is located at least between the conductive connecting members. A molding compound is formed on the first redistribution structure layer to cover the conductive connecting members and the stiffener. After forming the molding compound, a portion of the substrate and a portion of the conductive bars are removed to form a connection structure layer. The connection structure layer includes the substrate and multiple pads. A top surface and a bottom surface of each pad are respectively exposed to an upper surface and a lower surface of the substrate.

The chip package structure of the disclosure includes a package carrier and at least one chip. The package carrier includes a first redistribution structure layer, multiple conductive connecting members, a connection structure layer, at least one stiffener, and a molding compound. The first redistribution structure layer has a first surface and a second surface opposite to each other. The conductive connecting members are disposed on the first surface of the first redistribution structure layer and are electrically connected to the first redistribution structure layer. The connection structure layer is disposed on the second surface of the first redistribution structure layer. The connection structure layer includes a substrate and multiple pads. A top surface and a bottom surface of each pad are respectively exposed to an upper surface and a lower surface of the substrate. The pads are electrically connected to the first redistribution structure layer. The stiffener is disposed on the first surface of the first redistribution structure layer and is located at least between the conductive connecting members. The molding compound is disposed on the first surface of the first redistribution structure layer and covers the conductive connecting members and the stiffener. The chip is disposed on the package carrier and is electrically connected to the pads of the connection structure layer.

In order for the features of the disclosure to be more comprehensible, the following specific embodiments are described in detail in conjunction with the accompanying drawings.

DETAILED DESCRIPTION OF DISCLOSED EMBODIMENTS

Figure 1A:
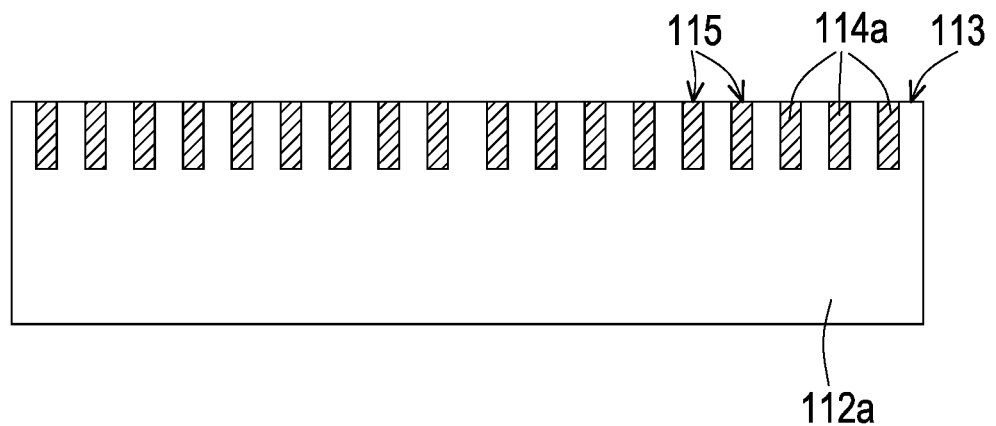
FIG. 1A to FIG. 1E are schematic cross-sectional views of a manufacturing method of a package carrier according to an embodiment of the disclosure.

FIG. 1A to FIG. 1E are schematic cross-sectional views of a manufacturing method of a package carrier according to an embodiment of the disclosure. Regarding the manufacturing method of the package carrier of the embodiment, firstly, please refer to FIG. 1A. A substrate 112a and multiple conductive bars 114a are provided. The conductive bars 114a are embedded in the substrate 112a, and an end 115 of each conductive bar 114a is exposed to a side 113 of the substrate 112a. Here, the material of the substrate 112a is, for example, glass, silicon, or other dielectric materials.

Figure 1B:
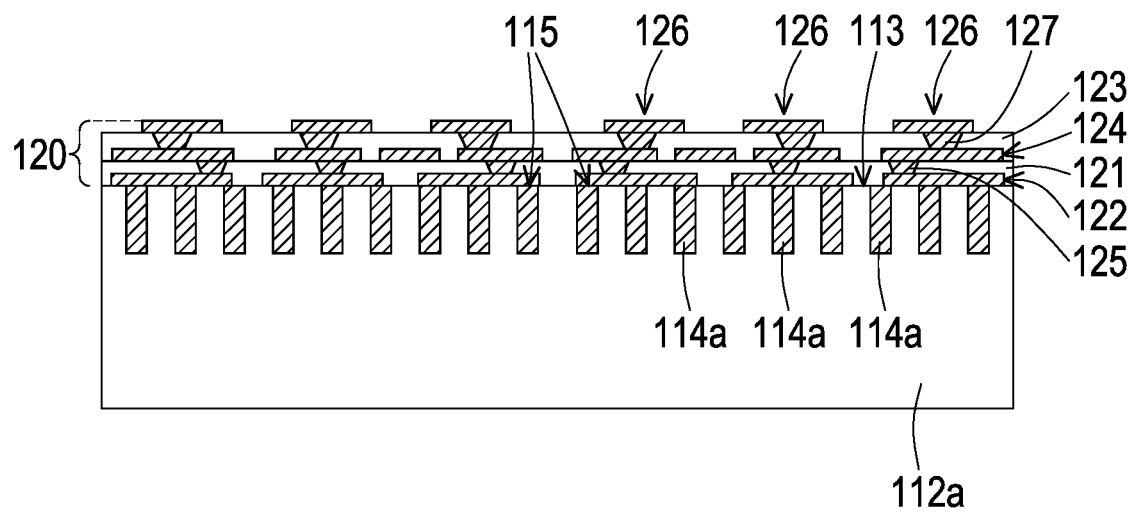

Next, please refer to FIG. 1B. A first redistribution structure layer 120 is formed on the side 113 of the substrate 112a. In detail, the first redistribution structure layer 120 includes multiple dielectric layers 121 and 123, multiple redistribution layers 122 and 124, multiple conductive vias 125 and 127, and multiple connecting pads 126. The redistribution layers 122 and 124 and the dielectric layers 121 and 123 are alternately stacked on the side 113 of the substrate 112a, and the connecting pads 126 are located on the dielectric layer 123. The redistribution layer 122 directly contacts and electrically connects to the end 115 of each conductive bar 114a and is electrically connected to the redistribution layer 124 through the conductive via 125. The redistribution layer 124 is electrically connected to the connecting pad 126 through the conductive via 127.

Figure 1C:
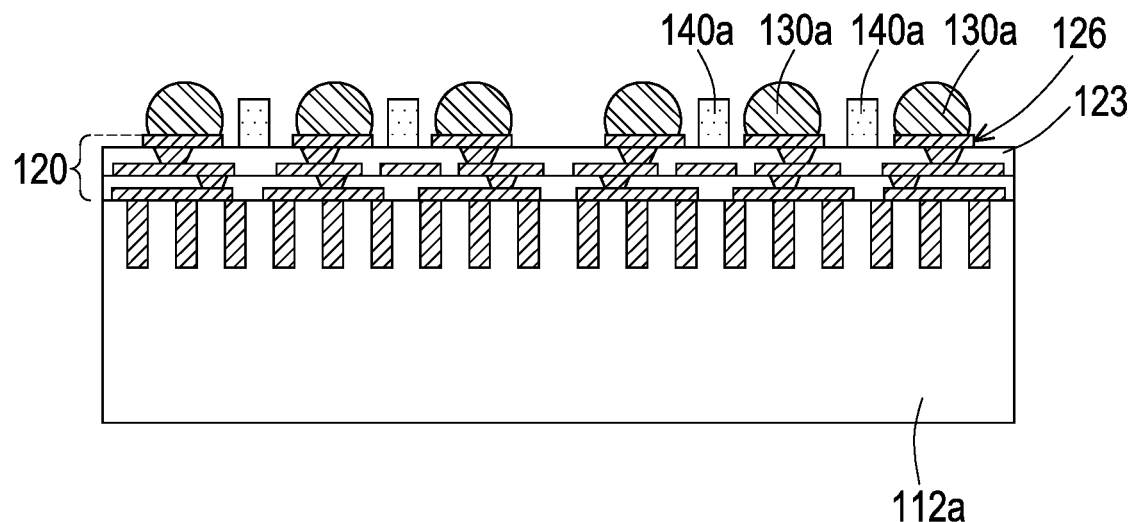

Next, please refer to FIG. 1C. Multiple conductive connecting members 130a and at least one stiffener (multiple stiffeners 140a are schematically shown) are formed on the first redistribution structure layer 120, wherein the stiffeners 140a are located at least between the conductive connecting members 130a. Furthermore, the conductive connecting member 130a of the embodiment is, for example, a solder ball, wherein the conductive connecting member 130a is directly located on the connecting pad 126 of the first redistribution structure layer 120. The stiffeners 140a are directly located on the dielectric layer 123 and do not contact the connecting pads 126, wherein the material of the stiffener 140a is, for example, steel, aluminum, copper, silicon, or glass, but not limited thereto. It should be noted that the embodiment does not limit the order of forming the conductive connecting members 130a and the stiffeners 140a, and the order of forming the conductive connecting members 130a and the stiffeners 140a may be determined according to requirements.

Figure 1D:
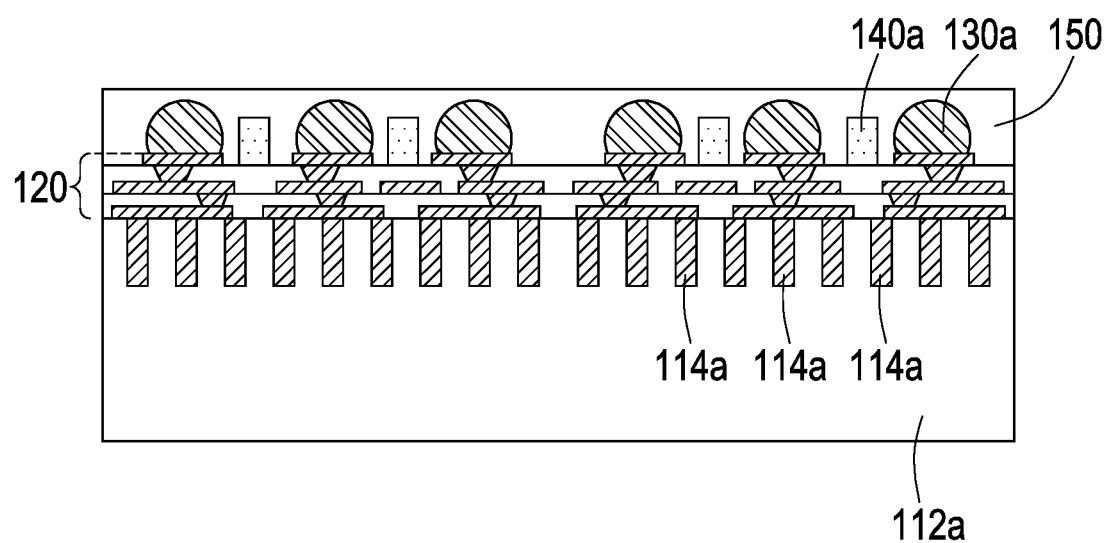

Then, please refer to FIG. 1D. A molding compound 150 is formed on the first redistribution structure layer 120 to cover the conductive connecting members 130a and the stiffeners 140a. Here, the molding compound 150 completely covers the conductive connecting members 130a and the stiffeners 140a. If necessary, a grinding process may be optionally added to grind the over-thick molding compound 150.

Figure 1E:
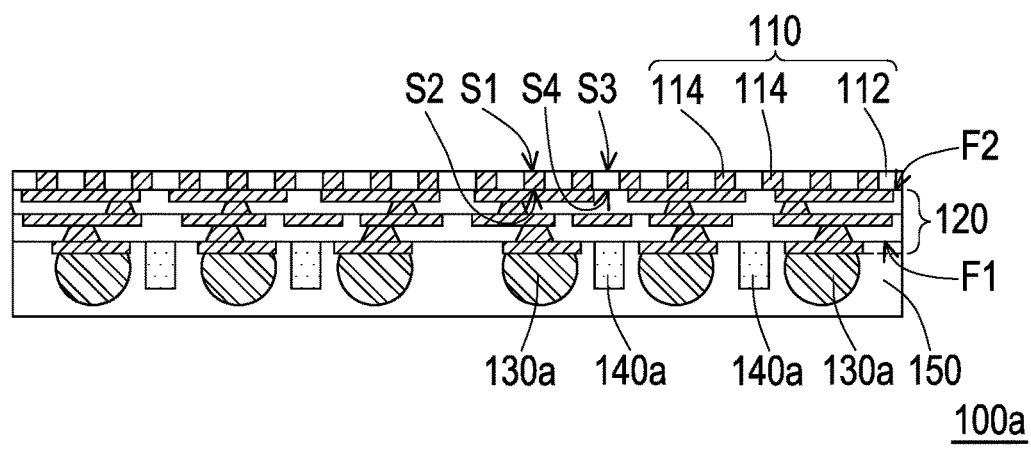

Finally, please refer to FIG. 1D and FIG. 1E at the same time. After forming the molding compound 150, a thinning process is performed to remove a portion of the substrate 112a and a portion of the conductive bars 114a to form a connection structure layer 110. Here, the connection structure layer 110 includes a substrate 112 and multiple pads 114, wherein the substrate 112 is substantially a portion of the substrate 112a, and the pads 114 are substantially a portion of the conductive bars 114a. A top surface S1 and a bottom surface S2 of each pad 114 are respectively exposed to an upper surface S3 and a lower surface S4 of the substrate 112. In an embodiment, the top surface S1 and the bottom surface S2 of each pad 114 are respectively aligned with the upper surface S3 and the lower surface S4 of the substrate 112. In addition, it should be noted that a surface treatment process may be optionally performed on the connection structure layer 110 here according to the requirements of subsequent chip bonding. For example, if the material of the substrate 112 is silicon, a dielectric material layer needs to be added; and if the material of the substrate 112 is glass, the dielectric material layer does not need to be added. In addition, according to the subsequently adopted bonding manner (for example, micro bump bonding or hybrid bonding), different surface treatment processes must be performed on the pads 114. So far, the manufacturing of a package carrier 100a has been completed.

In terms of structure, please refer to FIG. 1E again. The package carrier 100a includes the first redistribution structure layer 120, the conductive connecting members 130a, the connection structure layer 110, the stiffeners 140a, and the molding compound 150. The first redistribution structure layer 120 has a first surface F1 and a second surface F2 opposite to each other. The conductive connecting members 130a are disposed on the first surface F1 of the first redistribution structure layer 120 and are electrically connected to the first redistribution structure layer 120. The connection structure layer 110 is disposed on the second surface F2 of the first redistribution structure layer 120. The connection structure layer 110 includes the substrate 112 and the pads 114. The top surface S1 and the bottom surface S2 of each pad 114 are respectively exposed to the upper surface S3 and the lower surface S4 of the substrate 112. The pads 114 are electrically connected to the first redistribution structure layer 120. The stiffeners 140a are disposed on the first surface F1 of the first redistribution structure layer 120 and are located at least between the conductive connecting members 130a. The molding compound 150 is disposed on the first surface F1 of the first redistribution structure layer 120 and covers the conductive connecting members 130a and the stiffeners 140a.

In short, the package carrier 100a of the embodiment suppresses and reduces the warpage of the carrier through disposing the stiffeners 140a. Furthermore, a build-up process of a circuit board, that is the first redistribution structure layer 120, is integrated in the package carrier 100a of the embodiment. The conductive connecting members 130a and the stiffeners 140a are disposed on the same surface of the first redistribution structure layer 120, and the molding compound 150 covers the conductive connecting members 130a and the stiffeners 140a, so as to suppress and reduce the warpage of the package carrier 100a, so that the package carrier 100a of the embodiment has better flatness and structural reliability. In addition, during the manufacturing process of the package carrier 100a of the embodiment, the use of a temporary substrate is not required, so there is no need to perform a laser debonding process, which could effectively reduce the manufacturing cost.

FIG. 1F to FIG. 1J are schematic cross-sectional views of a manufacturing method of disposing chips on the package carrier in FIG. 1E to form a chip package structure.

Figure 1F:
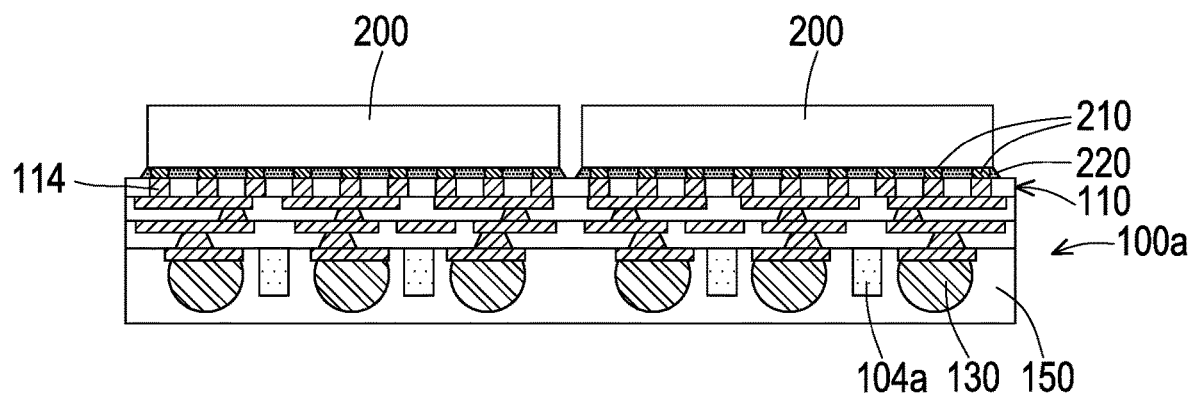
FIG. 1F to FIG. 1J are schematic cross-sectional views of a manufacturing method of disposing chips on the package carrier in FIG. 1E to form a chip package structure.

Next, please refer to FIG. 1F. At least one chip (two chips 200 are schematically shown) is disposed on the package carrier 100a, wherein the chips 200 may be electrically connected to the pads 114 of the connection structure layer 110 through micro bump bonding or hybrid bonding. Here, as shown in FIG. 1F, the chips 200 are electrically connected to the pads 114 through micro bumps 210, and an underfill 220 is then filled between the package carrier 100a and the chips 200, so that the underfill 220 covers the micro bumps 210. In an embodiment, the contact pitch of the chips 200 is 10 micrometers to 80 micrometers.

Figure 1G:
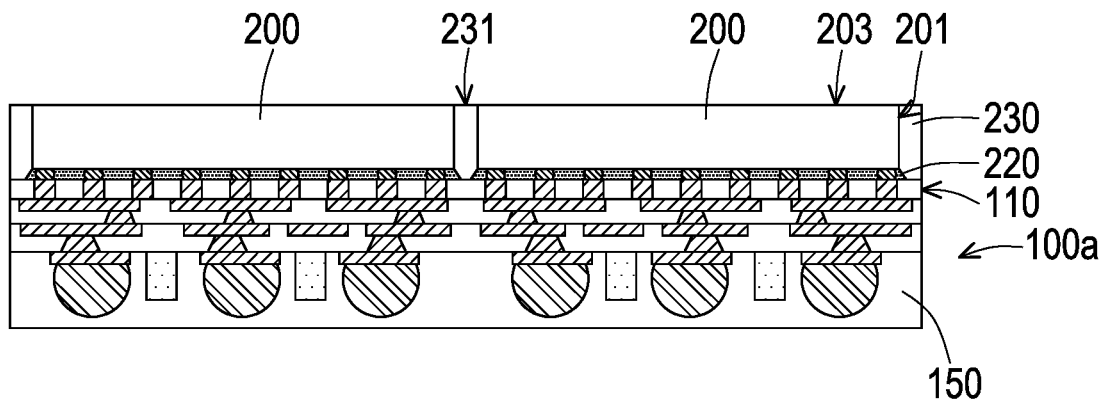

Next, please refer to FIG. 1G. A sealing material 230 is formed on the connection structure layer 110 of the package carrier 100a and covers surrounding surfaces 201 of the chips 200 to increase the structural strength and reliability. Optionally, the grinding process is performed on the sealing material 230, so that a back surface 203 of the chip 200 is exposed to a surface 231 of the sealing material 230, which could have a better heat dissipation effect.

Figure 1H:
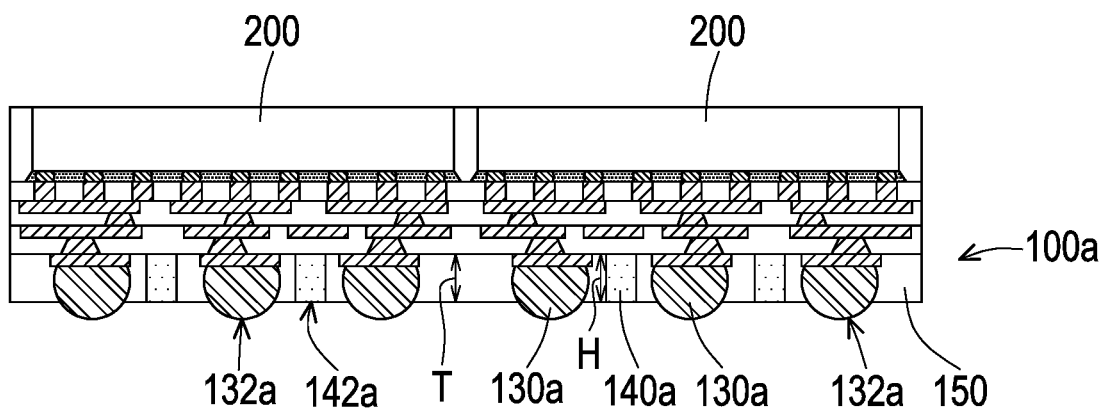

Then, please refer to FIG. 1G and FIG. 1H at the same time. A dry etching process is performed to remove a portion of the molding compound 150 to expose at least a first bottom surface 132a of each conductive connecting member 130a. Here, the molding compound 150 also exposes a second bottom surface 142a of each stiffener 140a at the same time. The stiffener 140a has a length H, the molding compound 150 has a thickness T, and the length H is equal to the thickness T. In another embodiment that is not shown, the length of the stiffener may also be less than the thickness of the molding compound, that is, the stiffener may not be exposed to the molding compound.

Figure 1I:
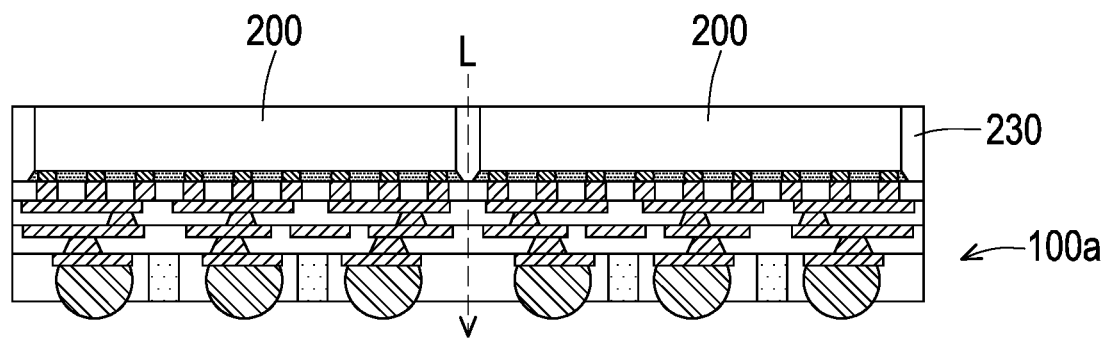
Figure 1J:
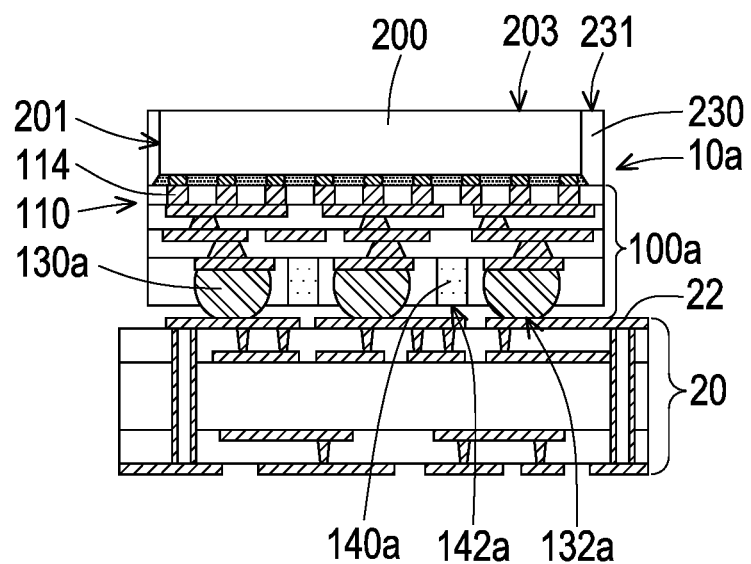

Finally, please refer to FIG. 1I and FIG. 1J at the same time. A singulation process is performed to cut the sealing material 230 and the package carrier 100a along a cutting line L to form the manufacturing of a chip package structure 10a.

In terms of structure, please refer to FIG. 1J again. The chip package structure 10a of the embodiment includes the package carrier 100a and the chips 200 in FIG. 1E, wherein the chips 200 are disposed on the package carrier 100a and are electrically connected to the pads 114 of the connection structure layer 110. Furthermore, the chips 200 may be electrically connected to the pads 114 of the connection structure layer 110 through micro bump bonding or hybrid bonding. Furthermore, the chip package structure 10a of the embodiment also includes the sealing material 230, which is disposed on the connection structure layer 110 of the package carrier 100a and covers the surrounding surfaces 201 of the chips 200, and the back surface 203 of the chip 200 is exposed to the surface 231 of the sealing material 230. Here, the edge of the sealing material 230 exposes the edge of the package carrier 100a, and the molding compound 150 exposes the first bottom surface 132a of each conductive connecting member 130a and the second bottom surface 142a of the stiffener 140a.

In terms of application, as shown in FIG. 1J, the chip package structure 10a may be electrically connected to a pad 22 on a driving substrate 20 through the conductive connecting member 130a to be electrically connected to the driving substrate 20. Here, the driving substrate 20 may be, for example, a printed circuit board, but not limited thereto.

During the manufacturing process of the package carrier 100a of the embodiment, since the molding compound 150 covers the conductive connecting members 130a and the stiffeners 140a, the back surface of the package carrier 100a becomes flat. Therefore, during the subsequent manufacturing of the chip package structure 10a, the package carrier 100a has better flatness, which facilitates the configuration of the chips 200 on the front surface of the package carrier 100a and is suitable for implementing the electrical connection between the chips 200 and the pads 114 by adopting micro bump bonding or hybrid bonding, so as to have a better packaging yield.

It must be noted here that the following embodiments continue to use the reference numerals and some content of the foregoing embodiment, wherein the same reference numerals are adopted to represent the same or similar elements, and the description of the same technical content is omitted. For the description of the omitted parts, reference may be made to the foregoing embodiment, which will not be repeated in the following embodiments.

FIG. 2A to FIG. 2D are schematic cross-sectional views of a manufacturing method of a package carrier according to another embodiment of the disclosure. The manufacturing method of the package carrier of the present embodiment is similar to the abovementioned manufacturing method of the package carrier, and the difference between the two is that after the step in FIG. 1B, that is, after forming the first redistribution structure layer 120 on the side 113 of the substrate 112a, please refer to FIG. 2A. A second redistribution structure layer 160 is formed on the first redistribution structure layer 120. In detail, the second redistribution structure layer 160 includes multiple dielectric layers 161 and 163, a redistribution layer 162, multiple conductive vias 165 and 167, and multiple connecting pads 164. The redistribution layer 162 and the dielectric layers 161 and 163 are alternately stacked on the first redistribution structure layer 120, and the connecting pads 164 are located on the dielectric layer 163. The redistribution layer 162 is electrically connected to the first redistribution structure layer 120 through the conductive vias 165. The connecting pad 164 is electrically connected to the redistribution layer 162 through the conductive via 167. Here, the line width and the line spacing of the second redistribution structure layer 160 are greater than the line width and the line spacing of the first redistribution structure layer 120.

Figure 2A:
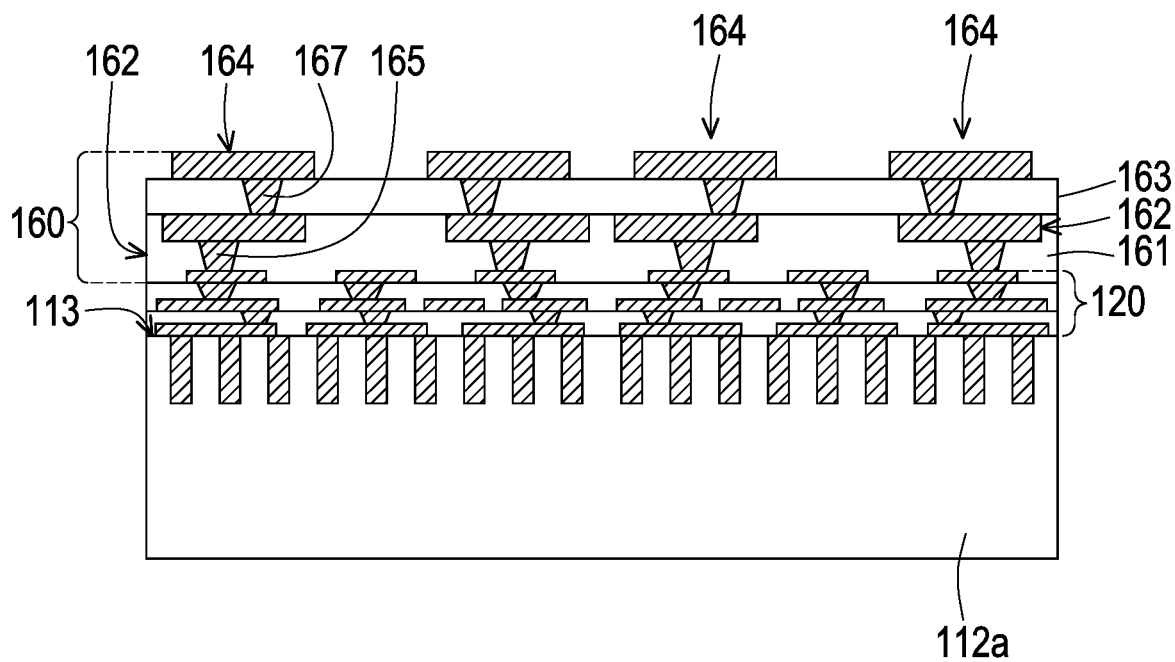
FIG. 2A to FIG. 2D are schematic cross-sectional views of a manufacturing method of a package carrier according to another embodiment of the disclosure.
Figure 2B:
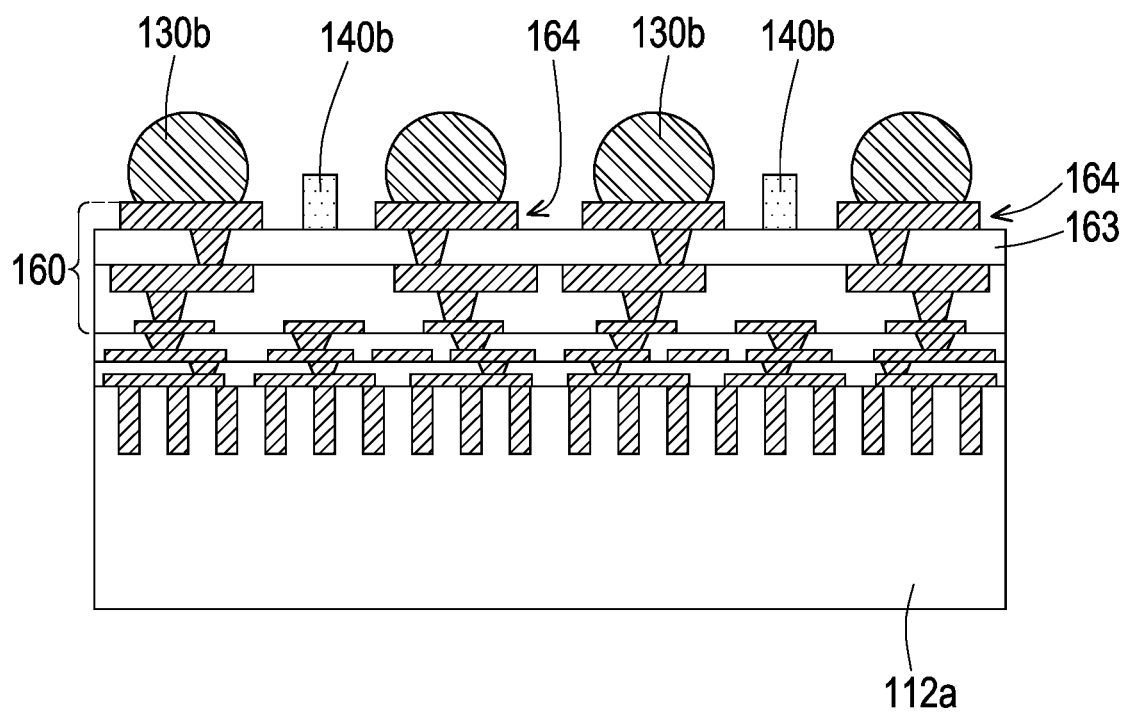

Next, please refer to FIG. 2B. Multiple conductive connecting members 130b and at least one stiffener (multiple stiffeners 140b are schematically shown) are formed on the second redistribution structure layer 160, wherein the stiffeners 140b are located at least between the conductive connecting members 130b. Furthermore, the conductive connecting member 130b of the embodiment is, for example, a solder ball, wherein the conductive connecting member 130b is directly located on the connecting pad 164 of the second redistribution structure layer 160. The stiffeners 140b are directly located on the dielectric layer 163 and do not contact the connecting pads 164, wherein the material of the stiffener 140b is, for example, steel, aluminum, copper, silicon, or glass, but not limited thereto. It should be noted that the embodiment does not limit the order of forming the conductive connecting members 130b and the stiffeners 140b, and the order of forming the conductive connecting members 130b and the stiffeners 140b may be determined according to requirements.

Figure 2C:
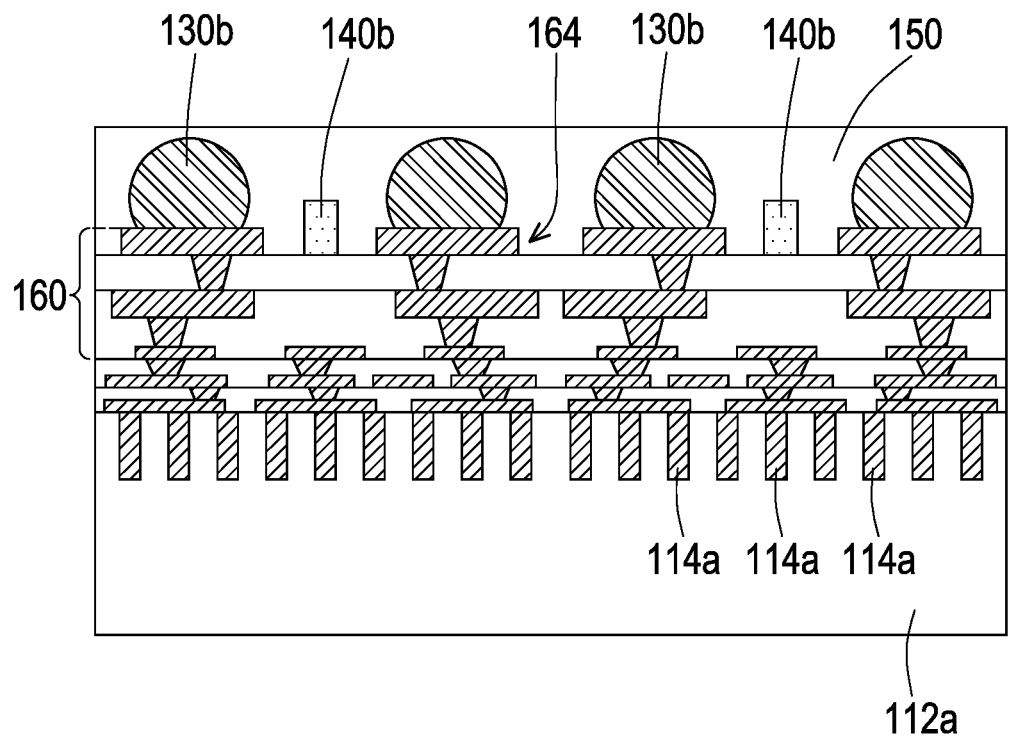

Then, please refer to FIG. 2C. The molding compound 150 is formed on the second redistribution structure layer 160 to cover the conductive connecting members 130b and the stiffeners 140b. Here, the molding compound 150 completely covers the conductive connecting members 130b and the stiffeners 140b. If necessary, the grinding process may be optionally added to grind the over-thick molding compound 150.

Figure 2D:
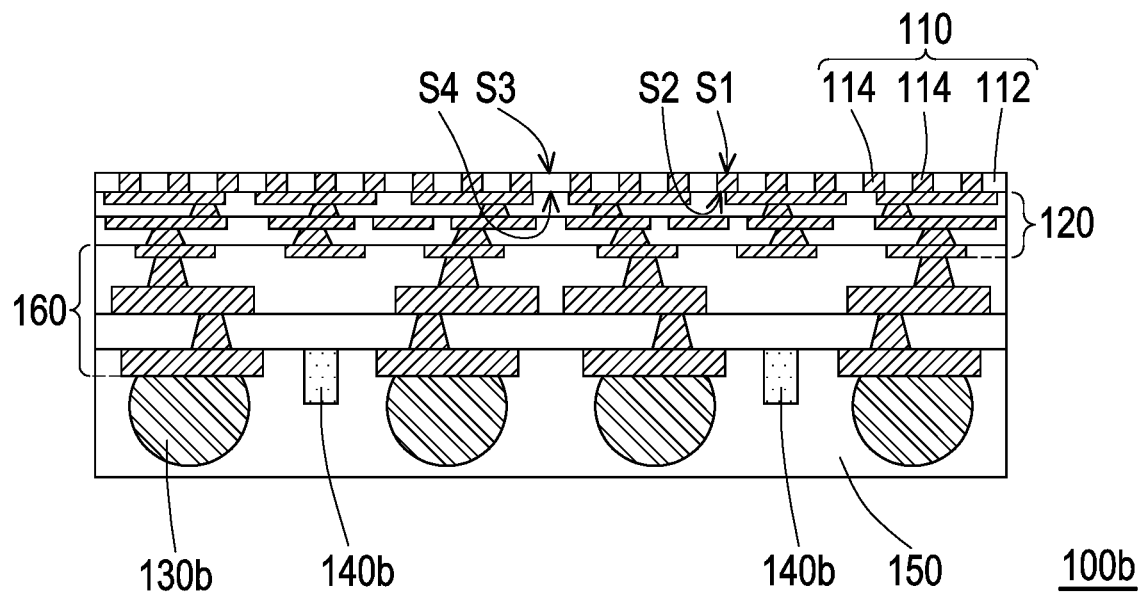

Finally, please refer to FIG. 2C and FIG. 2D at the same time. After forming the molding compound 150, the thinning process is performed to remove a portion of the substrate 112a and a portion of the conductive bars 114a to form the connection structure layer 110. The connection structure layer 110 includes the substrate 112 and the pads 114, wherein the substrate 112 is substantially a portion of the substrate 112a, and the pads 114 are substantially a portion of the conductive bars 114a. The top surface S1 and the bottom surface S2 of each pad 114 are respectively exposed to the upper surface S3 and the lower surface S4 of the substrate 112. In addition, it should be noted that the surface treatment process may be optionally performed on the connection structure layer 110 here according to the requirements of subsequent chip bonding. For example, if the material of the substrate 112 is silicon, a dielectric material layer needs to be added; and if the material of the substrate 112 is glass, the dielectric material layer does not need to be added. In addition, according to the subsequently adopted bonding manner (for example, micro bump bonding or hybrid bonding), different surface treatment processes must be performed on the pads 114. So far, the manufacturing of a package carrier 100b has been completed.

FIG. 2E to FIG. 2I are schematic cross-sectional diagrams of a manufacturing method of disposing chips on the package carrier in FIG. 2D to form a chip package structure.

Figure 2E:
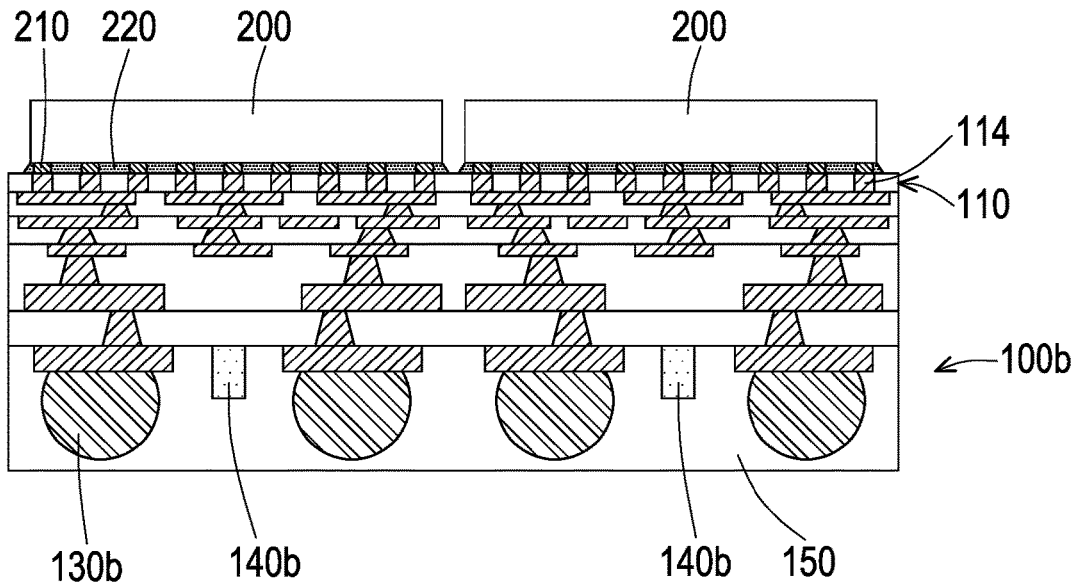
FIG. 2E to FIG. 2I are schematic cross-sectional diagrams of a manufacturing method of disposing chips on the package carrier in FIG. 2D to form a chip package structure.

Next, please refer to FIG. 2E. At least one chip (two chips 200 are schematically shown) on the package carrier 100b, wherein the chips 200 may be electrically connected to the pads 114 of the connection structure layer 110 through micro bump bonding or hybrid bonding. Here, as shown in FIG. 2E, the chips 200 are electrically connected to the pads 114 through the micro bumps 210, and the underfill 220 is then filled between the package carrier 100b and the chips 200, so that the underfill 220 covers the micro bumps 210. In an embodiment, the contact pitch of the chips 200 is 10 micrometers to 80 micrometers.

Figure 2F:
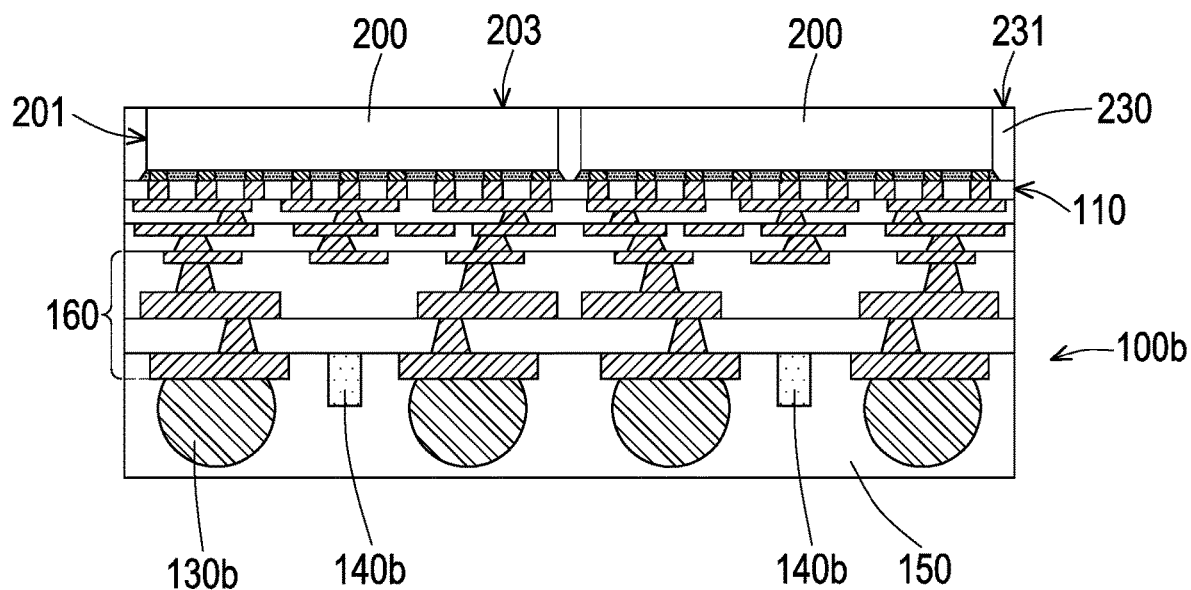

Next, please refer to FIG. 2F. The sealing material 230 is formed on the connection structure layer 110 of the package carrier 100b and covers the surrounding surfaces 201 of the chips 200 to increase the structural strength and reliability. Optionally, the grinding process is performed on the sealing material 230, so that the back surface 203 of the chip 200 is exposed to the surface 231 of the sealing material 230, which could have a better heat dissipation effect.

Figure 2G:
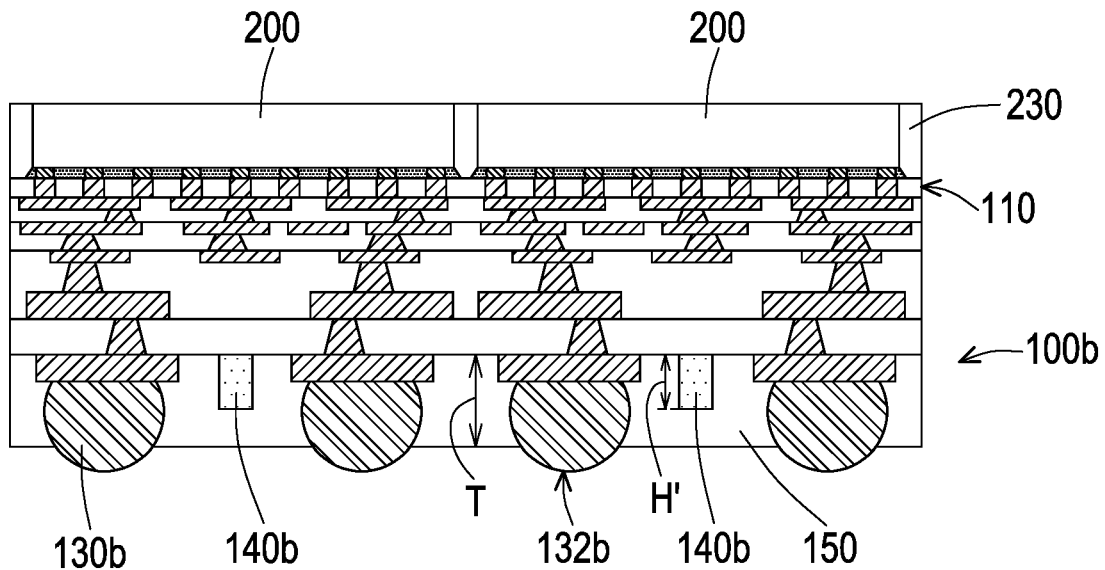

Then, please refer to FIG. 2F and FIG. 2G at the same time. The dry etching process is performed to remove a portion of the molding compound 150 to expose at least a first bottom surface 132b of each conductive connecting member 130b. Here, the stiffener 140b has a length H', the molding compound 150 has the thickness T, and the length H' is less than the thickness T.

Figure 2H:
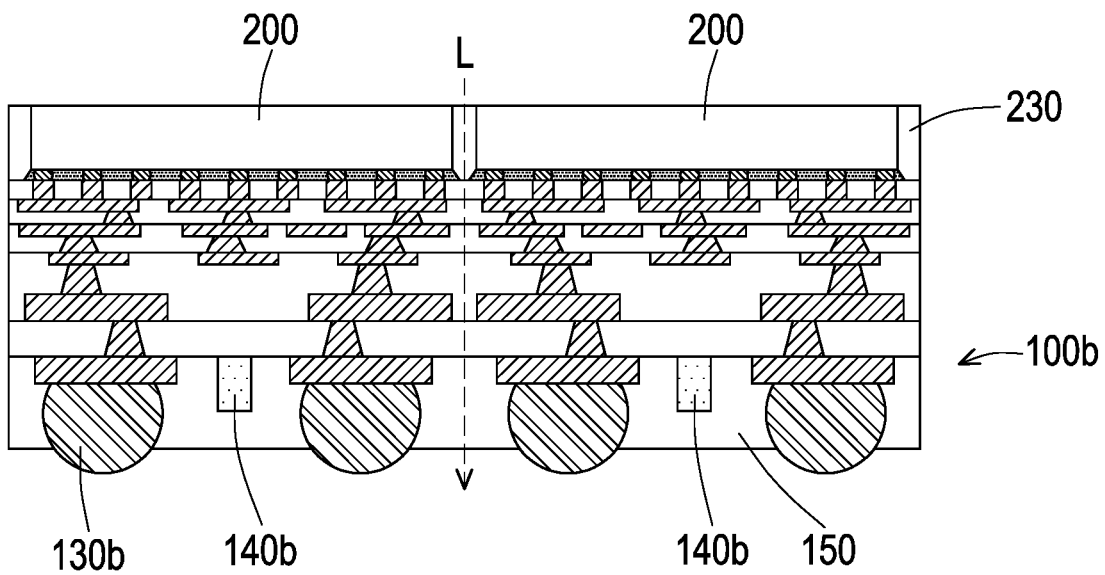
Figure 2I:
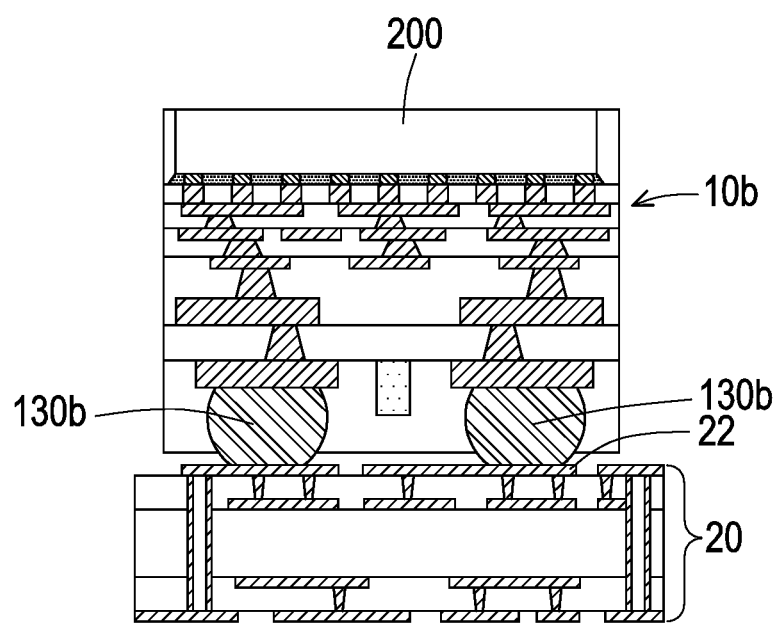

Finally, please refer to FIG. 2H and FIG. 2I at the same time. The singulation process is performed to cut the sealing material 230 and the package carrier 100b along the cutting line L to form the manufacturing of a chip package structure 10b.

In terms of application, as shown in FIG. 2I, the chip package structure 10b may be electrically connected to the pad 22 on the driving substrate 20 through the conductive connecting member 130b to be electrically connected to the driving substrate 20. Here, the driving substrate 20 may be, for example, a printed circuit board, but not limited thereto.

Figure 3A:
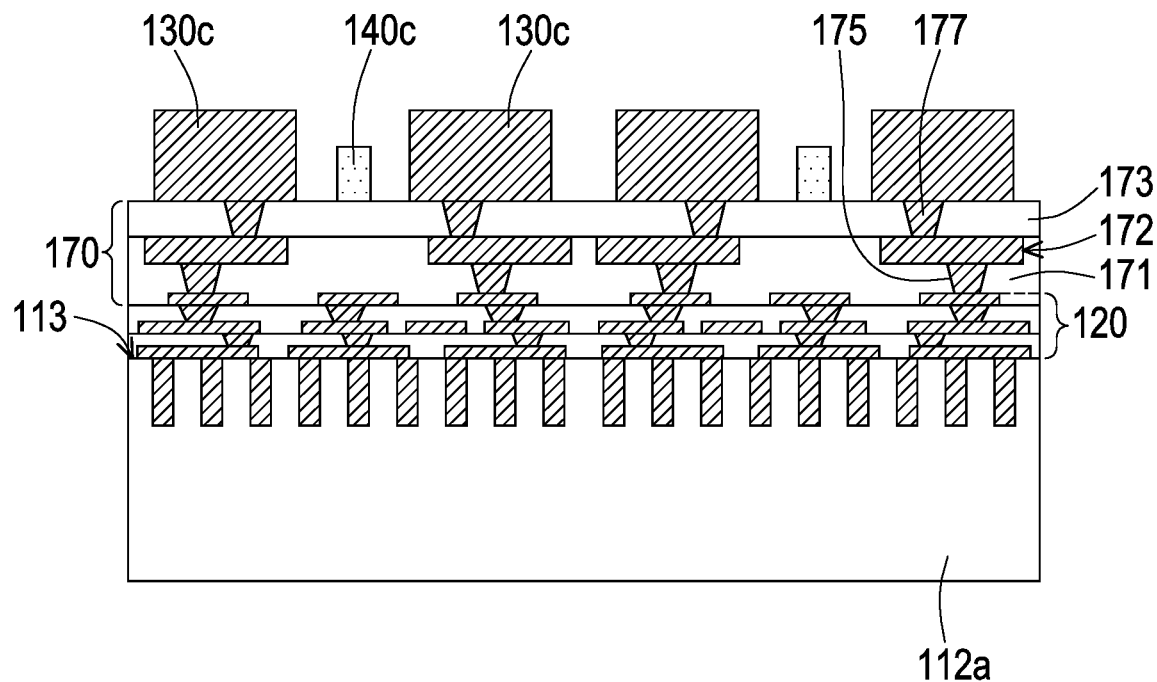
FIG. 3A to FIG. 3C are schematic cross-sectional views of a manufacturing method of a package carrier according to another embodiment of the disclosure.
Figure 3B:
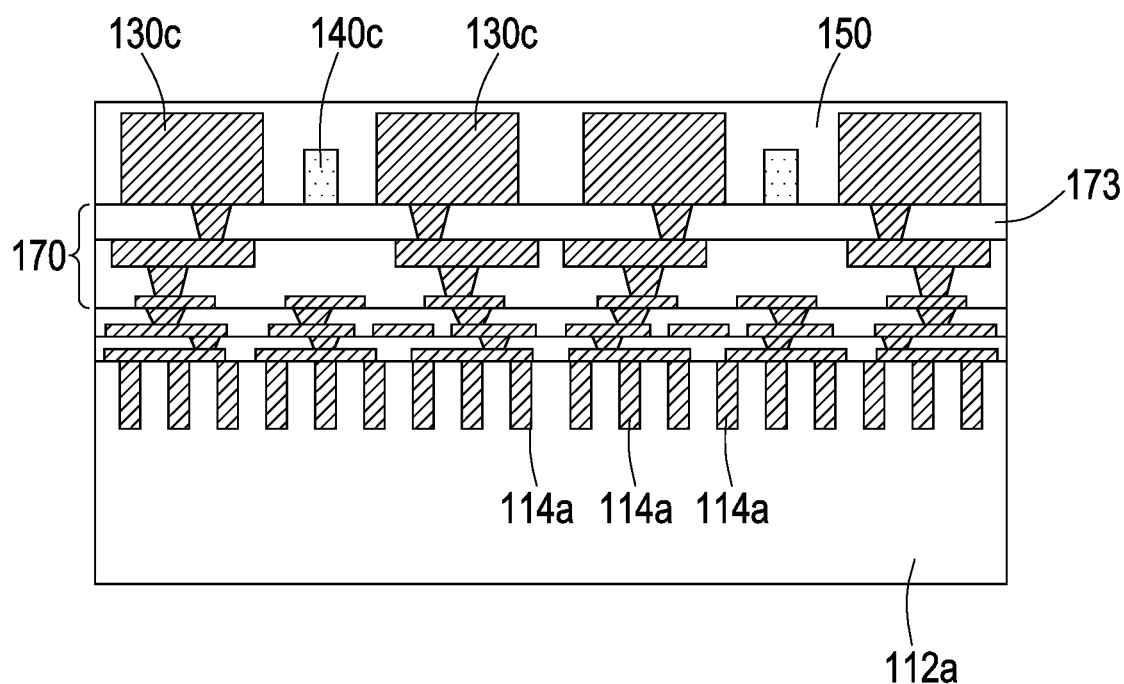
Figure 3C:
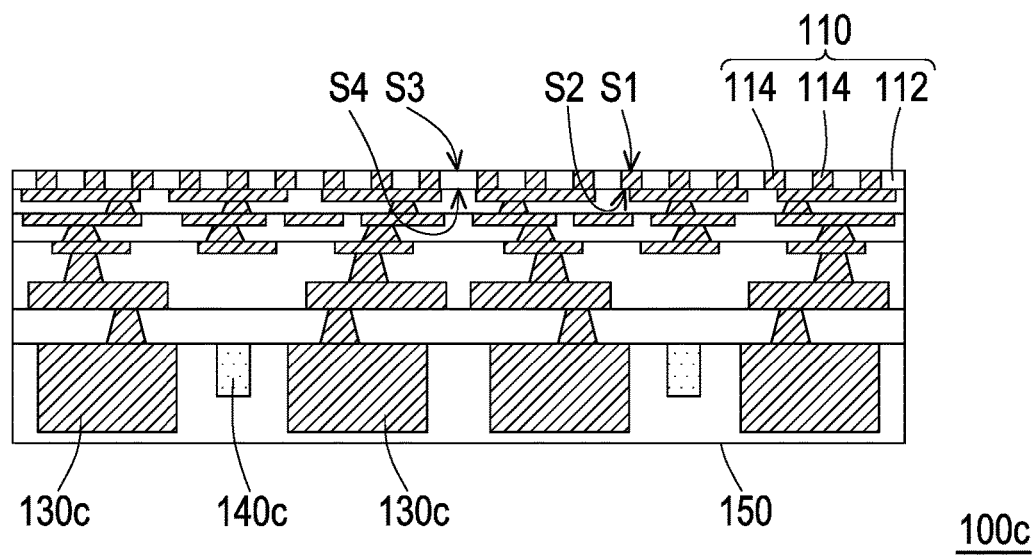

FIG. 3A to FIG. 3C are schematic cross-sectional views of a manufacturing method of a package carrier according to another embodiment of the disclosure. The manufacturing method of the package carrier of the present embodiment is similar to the abovementioned manufacturing method of the package carrier, and the difference between the two is that after the step in FIG. 1B, that is, after forming the first redistribution structure layer 120 on the side 113 of the substrate 112a, please refer to FIG. 3A. A second redistribution structure layer 170 is formed on the first redistribution structure layer 120. In detail, the second redistribution structure layer 170 includes multiple dielectric layers 171 and 173, a redistribution layer 172, and multiple conductive vias 175, 177. The redistribution layer 172 and the dielectric layers 171 and 173 are alternately stacked on the first redistribution structure layer 120. The redistribution layer 172 is electrically connected to the first redistribution structure layer 120 through the conductive via 175. Here, the line width and the line spacing of the second redistribution structure layer 170 are greater than the line width and the line spacing of the first redistribution structure layer 120.

Next, please refer to FIG. 3A again. Multiple conductive connecting members 130c and at least one stiffener (multiple stiffeners 140c are schematically shown) are formed on the second redistribution structure layer 170, wherein the stiffeners 140c are located at least between the conductive connecting members 130c. Furthermore, the conductive connecting member 130c of the embodiment is, for example, a copper pillar, wherein the conductive connecting member 130c is directly located on the conductive via 177 of the second redistribution structure layer 170. The stiffeners 140c are directly located on the dielectric layer 173 and do not contact the conductive vias 177, wherein the material of the stiffener 140c is, for example, steel, aluminum, copper, silicon, or glass, but not limited thereto. It should be noted that the embodiment does not limit the order of forming the conductive connecting members 130c and the stiffeners 140c, and the order of forming the conductive connecting members 130c and the stiffeners 140c may be determined according to requirements.

Then, please refer to FIG. 3B. The molding compound 150 is formed on the second redistribution structure layer 170 to cover the conductive connecting members 130c and the stiffeners 140c. Here, the molding compound 150 completely covers the conductive connecting members 130c and the stiffeners 140c. If necessary, the grinding process may be optionally added to grind the over-thick molding compound 150.

Finally, please refer to FIG. 3B and FIG. 3C at the same time. After forming the molding compound 150, the thinning process is performed to remove a portion of the substrate 112a and a portion of the conductive bars 114a to form the connection structure layer 110. The connection structure layer 110 includes the substrate 112 and the pads 114, wherein the substrate 112 is substantially a portion of the substrate 112a, and the pads 114 are substantially a portion of the conductive bars 114a. The top surface S1 and the bottom surface S2 of each pad 114 are respectively exposed to the upper surface S3 and the lower surface S4 of the substrate 112. In addition, it should be noted that the surface treatment process may be optionally performed on the connection structure layer 110 here according to the requirements of subsequent chip bonding. For example, if the material of the substrate 112 is silicon, a dielectric material layer needs to be added; and if the material of the substrate 112 is glass, the dielectric material layer does not need to be added. In addition, according to the subsequent bonding method (for example, micro bump bonding or hybrid bonding), different surface treatment processes must be performed on the pads 114. So far, the manufacturing of a package carrier 100c has been completed.

FIG. 3D to FIG. 3H are schematic cross-sectional diagrams of a manufacturing method of disposing chips on the package carrier in FIG. 3C to form a chip package structure.

Figure 3D:
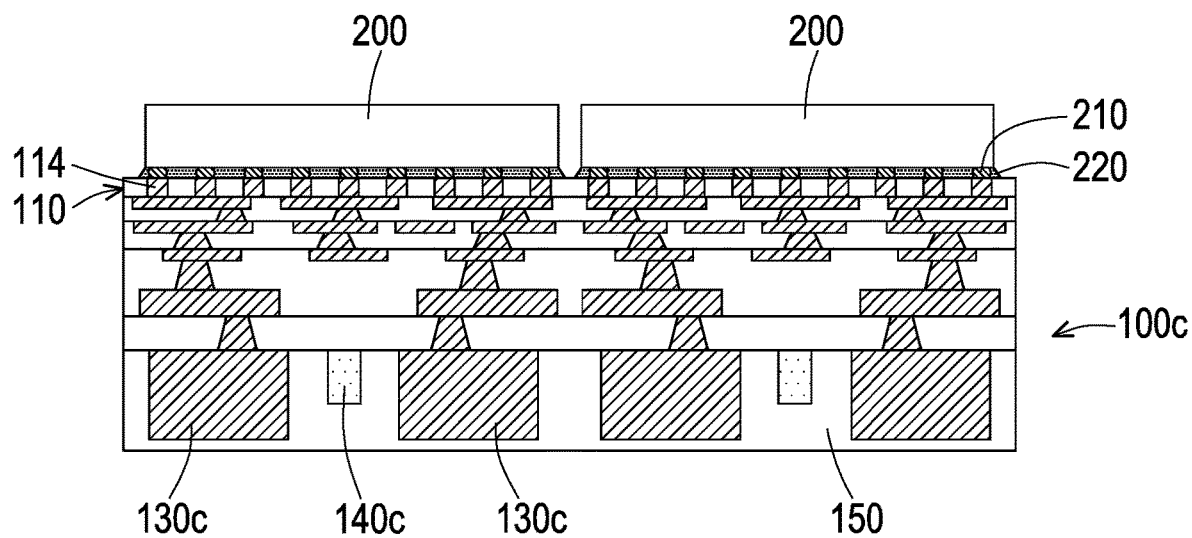
FIG. 3D to FIG. 3H are schematic cross-sectional diagrams of a manufacturing method of disposing chips on the package carrier in FIG. 3C to form a chip package structure.

Next, please refer to FIG. 3D. At least one chip (two chips 200 are schematically shown) is disposed on the package carrier 100c, wherein the chips 200 may be electrically connected to the pads 114 of the connection structure layer 110 through micro bump bonding or hybrid bonding. Here, as shown in FIG. 3D, the chips 200 are electrically connected to the pads 114 through the micro bumps 210, and the underfill 220 is then filled between the package carrier 100c and the chips 200, so that the underfill 220 covers the micro bumps 210. In an embodiment, the contact pitch of the chips 200 is 10 micrometers to 80 micrometers.

Figure 3E:
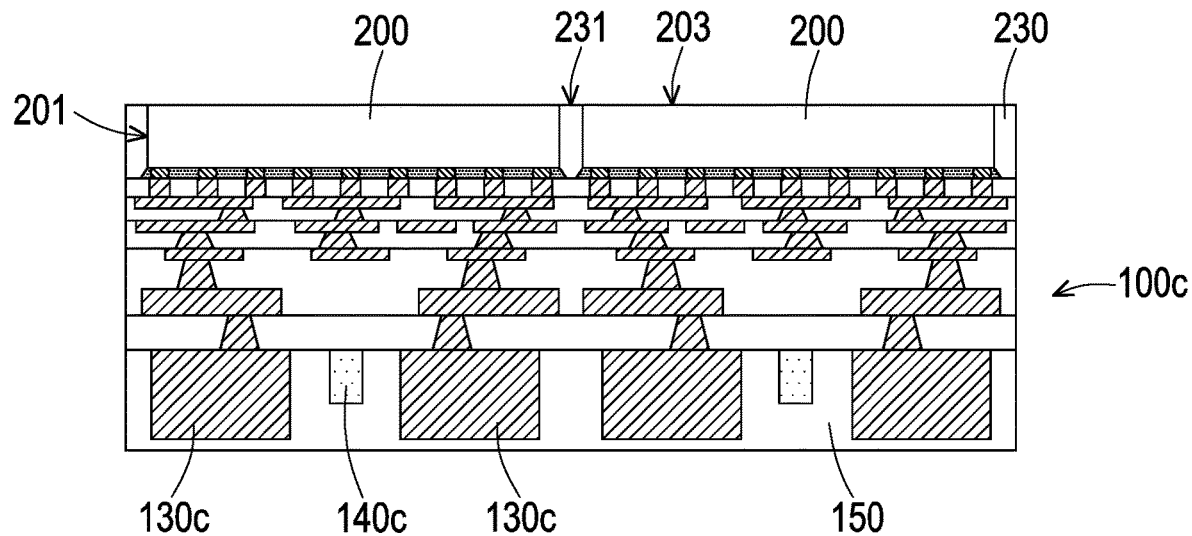

Next, please refer to FIG. 3E. The sealing material 230 is formed on the connection structure layer 110 of the package carrier 100c and covers the surrounding surfaces 201 of the chips 200 to increase the structural strength and reliability. Optionally, the grinding process is performed on the sealing material 230, so that the back surface 203 of the chip 200 is exposed to the surface 231 of the sealing material 230, which could have a better heat dissipation effect.

Figure 3F:
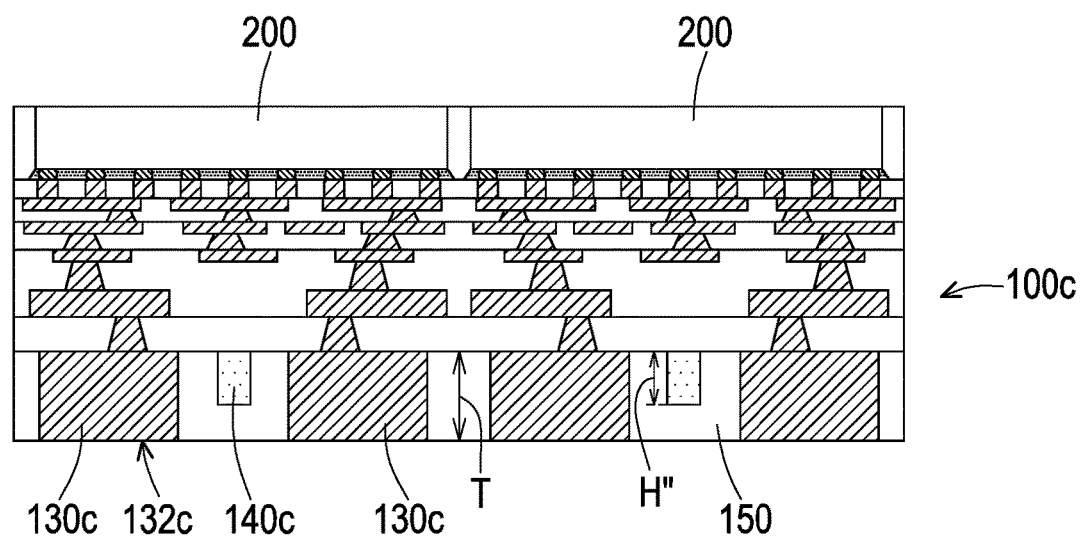

Then, please refer to FIG. 3E and FIG. 3F at the same time. The dry etching process is performed to remove a portion of the molding compound 150 to expose at least a first bottom surface 132c of each conductive connecting member 130c. Here, the stiffener 140c has a length H", the molding compound 150 has the thickness T, and the length H" is less than the thickness T.

Figure 3G:
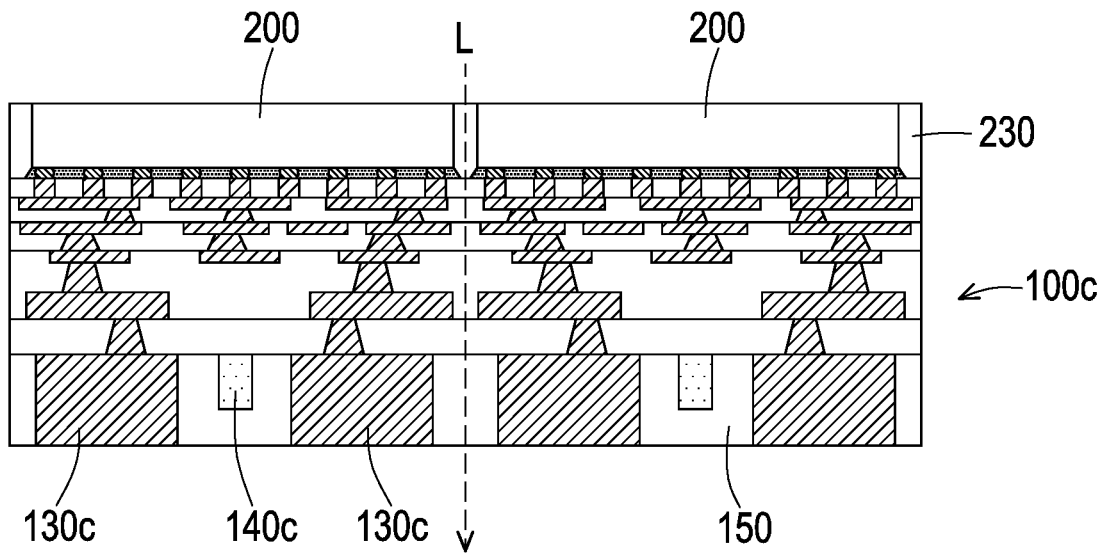
Figure 3H:
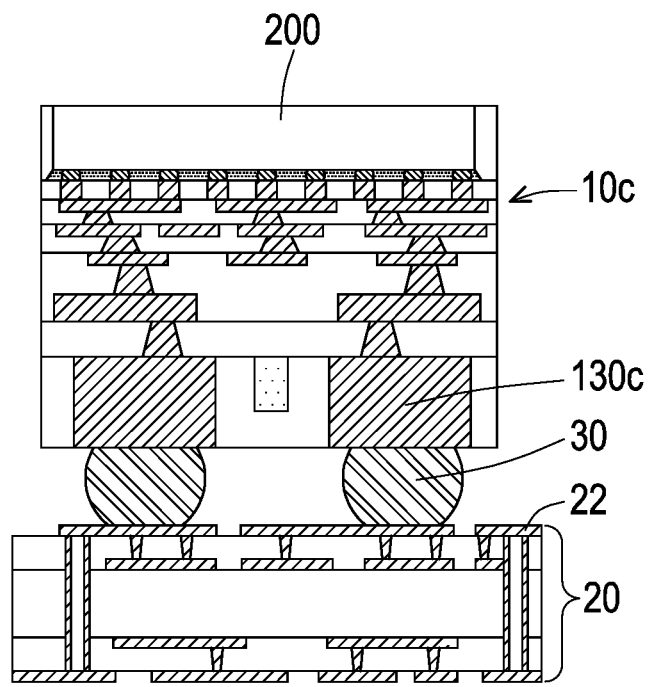

Finally, please refer to FIG. 3G and FIG. 3H at the same time. The singulation process is performed to cut the sealing material 230 and the package carrier 100c along the cutting line L to form the manufacturing of a chip package structure 10c.

In terms of application, as shown in FIG. 3H, the chip package structure 10c may be electrically connected to a solder ball 30 through the conductive connecting member 130c and is electrically connected to the pad 22 on the driving substrate 20 by the solder ball 30, so that the chip package structure 10c is electrically connected to the driving substrate 20. Here, the driving substrate 20 may be, for example, a printed circuit board, but not limited thereto.

Figure 4A:
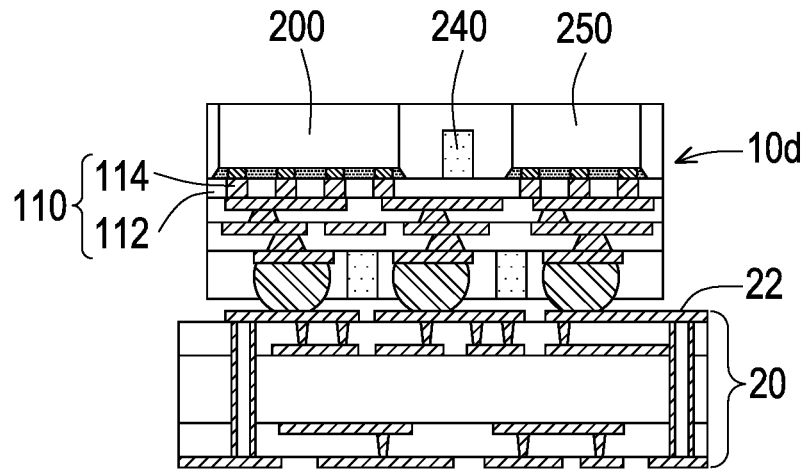
FIG. 4A is a schematic cross-sectional view of a chip package structure according to an embodiment of the disclosure.

FIG. 4A is a schematic cross-sectional view of a chip package structure according to an embodiment of the disclosure. Please refer to FIG. 1J and FIG. 4A at the same time. A chip package structure 10d of the present embodiment is similar to the chip package structure 10a in FIG. 1J, and the difference between the two is that in the present embodiment, the chip package structure 10d includes the chip 200 and a chip 250, wherein the property of the chip 200 is different from the property of the chip 250, and the size of the chip 200 is also different from the size of the chip 250. That is, the chip package structure 10d of the embodiment heterogeneously integrates different chips 200 and 250. In addition, in the chip package structure 10d of the embodiment, a stiffener 240 is also included, wherein the stiffener 240 is disposed between the chip 200 and the chip 250, and is directly located on the substrate 112 of the connection structure layer 110 without contacting the pad 114, so as to increase the overall structural strength of the chip package structure 10d.

Figure 4B:
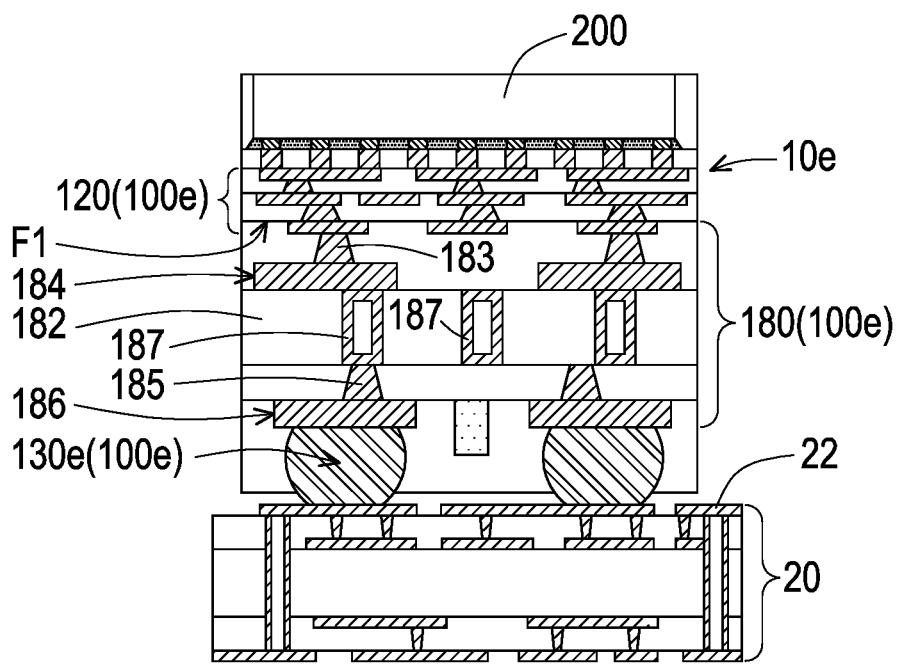
FIG. 4B is a schematic cross-sectional view of a chip package structure according to an embodiment of the disclosure.
Figure 5A:
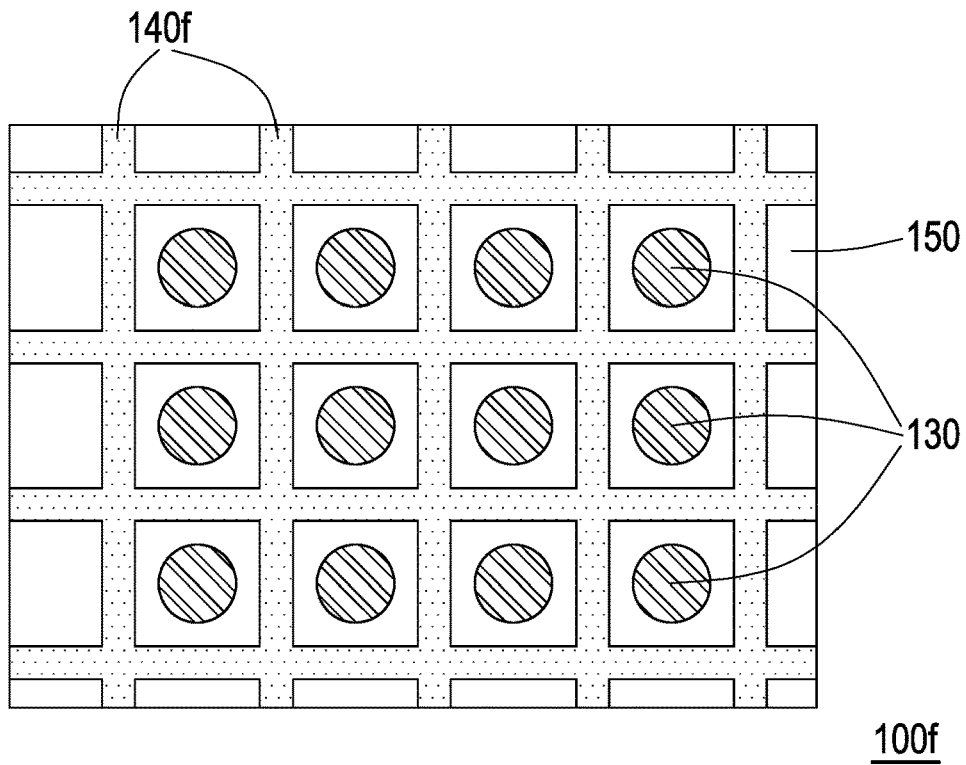
FIG. 5A to FIG. 5D are schematic bottom views of various package carriers according to various embodiments of the disclosure.
Figure 5B:
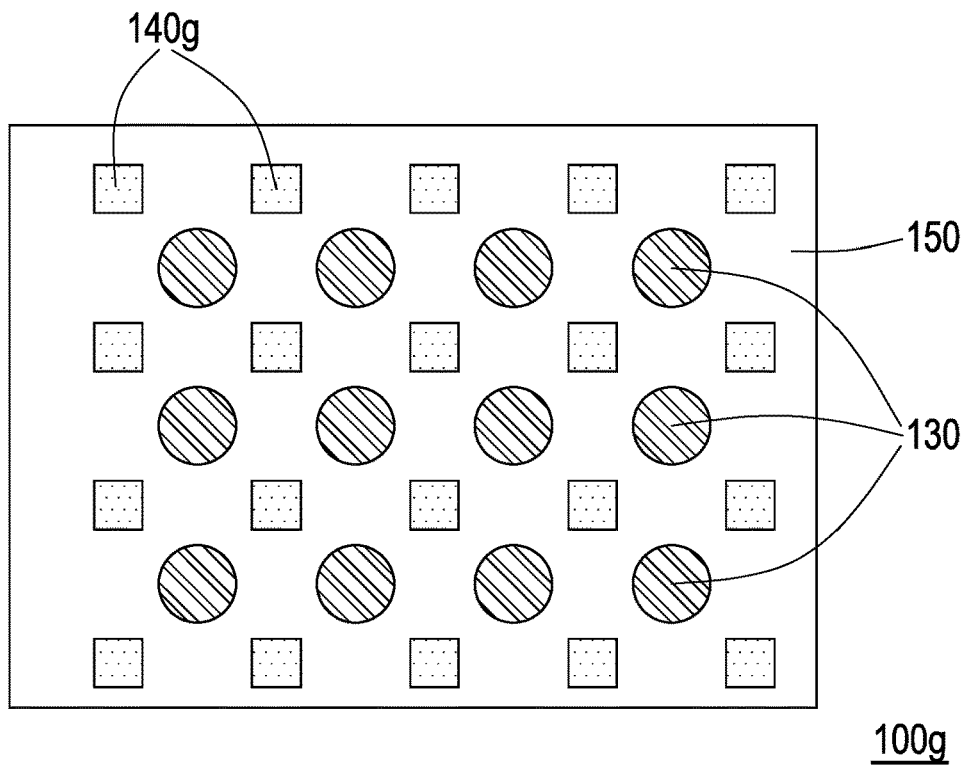
Figure 5C:
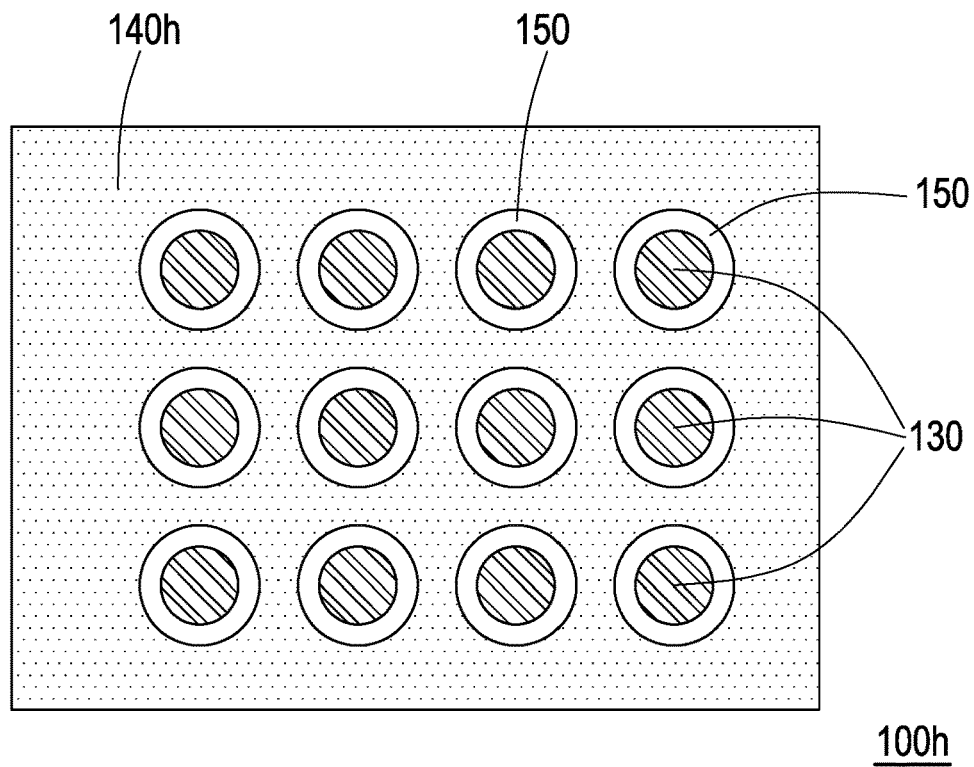
Figure 5D:
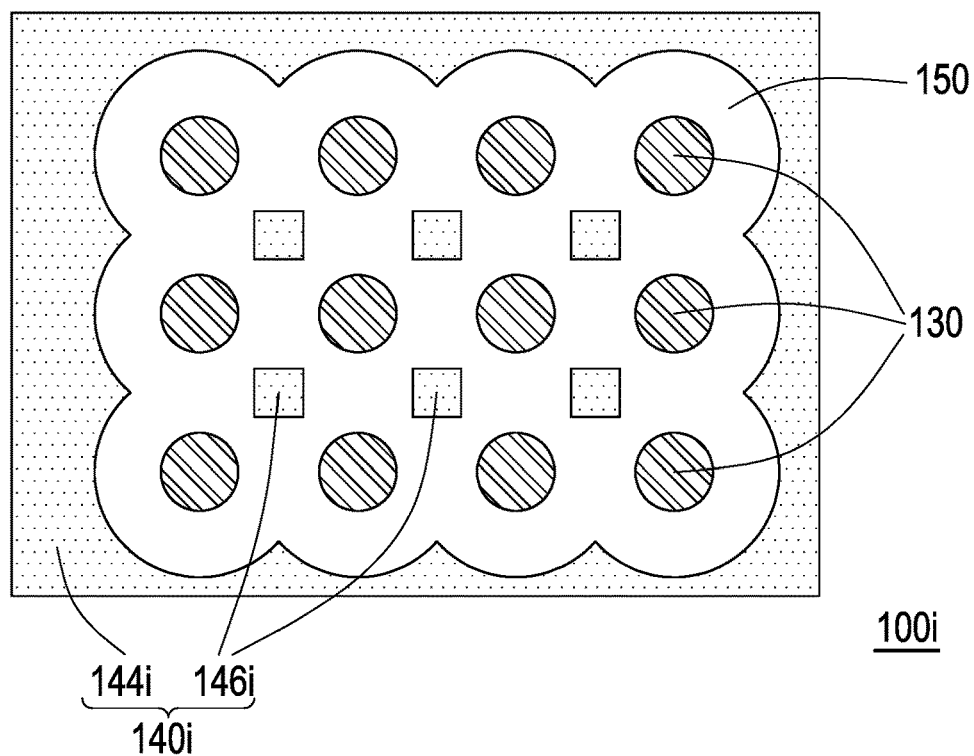

FIG. 4B is a schematic cross-sectional view of a chip package structure according to an embodiment of the disclosure. Please refer to FIG. 1J and FIG. 4B at the same time. A chip package structure 10e of the present embodiment is similar to the chip package structure 10a in FIG. 1J, and the difference between the two is that in the present embodiment, a package carrier 100e also includes a build-up structure layer 180, which is disposed on the first surface F1 of the first redistribution structure layer 120 and is located between conductive connecting members 130e and the first redistribution structure layer 120. In detail, the build-up structure layer 180 includes a glass fiber substrate 182, a first patterned conductive layer 184, a second patterned conductive layer 186, at least one first via (two first vias 183 are schematically shown), at least one second via (two second vias 185 are schematically shown), and at least one third via (three third vias 187 are schematically shown). The first patterned conductive layer 184 and the second patterned conductive layer 186 are respectively located on opposite sides of the glass fiber substrate 182. The third via 187 penetrates the glass fiber substrate 182 and electrically connects the first patterned conductive layer 184 and the second via 185. The first patterned conductive layer 184 is electrically connected to the first redistribution structure layer 120 through the first via 183. The second patterned conductive layer 186 is electrically connected to the third via 187 through the second via 185. The conductive connecting member 130e is connected to the second patterned conductive layer 186 and is electrically connected to the first redistribution structure layer 120 through the build-up structure layer 180.

FIG. 5A to FIG. 5D are schematic bottom views of various package carriers according to various embodiments of the disclosure. Please refer to FIG. 5A, FIG. 5C, and FIG. 5D at the same time. In package carriers 100f, 100h, and 100i, stiffeners 140f, 140h, and 140i are continuous structure layers, which could increase the overall structural strength of the package carriers 100f, 100h, and 100i through the material property (that is, rigidity) thereof to suppress and reduce the warpage of the package carriers 100f, 100h, and 100i. In detail, in the package carrier 100f in FIG. 5A, multiple stiffeners 140f are arranged into a grid shape to form a continuous structure layer, and the conductive connecting members 130 (for example, solder balls) are located in the grid shape; in the package carrier 100h in FIG. 5C, the stiffener 140h is a single continuous structure layer and surrounds the surrounding of the conductive connecting members 130; and in the package carrier 100i in FIG. 5D, the stiffener 140i includes a first stiffener 144i and multiple second stiffeners 146i, wherein the first stiffener 144i is a single continuous structure layer and surrounds the outer periphery of the distribution of the conductive connecting members 130, and the second stiffeners 146i are dispersedly arranged and distributed between the conductive connecting members 130. In addition, please refer to FIG. 5B. In a package carrier 100g, since the package carrier 100g itself has a specific structural strength, the stiffness could be increased through multiple stiffeners 140g dispersedly arranged, so as to enhance the structural strength of the package carrier 100g and further suppress and reduce the warpage of the package carrier 100g.

In summary, in the design of the package carrier of the disclosure, the conductive connecting members and the stiffener are disposed on the same surface of the first redistribution structure layer, and the molding compound covers the conductive connecting members and the stiffener, so as to suppress and reduce the warpage of the package carrier, so that the package carrier of the disclosure has better flatness and structural reliability. Furthermore, during the manufacturing process of the package carrier of the disclosure, the use of a temporary substrate is not required, so there is no need to perform the laser debonding process, which could effectively reduce the manufacturing cost. In addition, during the manufacturing process of the package carrier of the disclosure, the molding compound covers the conductive connecting members and the stiffener, so that the back surface of the package carrier becomes flat, which facilitates subsequent assembly of the chip onto the front surface of the package carrier. In addition, since the package carrier of the disclosure has better flatness, the chip package structure adopting the package carrier of the disclosure could have a better packaging yield.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A package carrier, comprising:
    a first redistribution structure layer, having a first surface and a second surface opposite to each other;
    a plurality of conductive connecting members, disposed on the first surface of the first redistribution structure layer and electrically connected to the first redistribution structure layer;
    a connection structure layer, disposed on the second surface of the first redistribution structure layer and comprising a substrate and a plurality of pads, wherein a top surface and a bottom surface of each of the pads are respectively exposed to an upper surface and a lower surface of the substrate, and the pads are electrically connected to the first redistribution structure layer;
    at least one stiffener, disposed on the first surface of the first redistribution structure layer and located at least between the conductive connecting members; and
    a molding compound, disposed on the first surface of the first redistribution structure layer and covering the conductive connecting members and the at least one stiffener.

2. The package carrier according to claim 1, wherein each of the conductive connecting members comprises a solder ball or a copper pillar.

3. The package carrier according to claim 1, further comprising:
    a second redistribution structure layer, disposed on the first surface of the first redistribution structure layer and located between the conductive connecting members and the first redistribution structure layer, wherein the conductive connecting members are electrically connected to the first redistribution structure layer through the second redistribution structure layer.

4. The package carrier according to claim 3, wherein a line width and a line spacing of the second redistribution structure layer are greater than a line width and a line spacing of the first redistribution structure layer.

5. The package carrier according to claim 1, further comprising:
    a build-up structure layer, disposed on the first surface of the first redistribution structure layer, located between the conductive connecting members and the first redistribution structure layer, and comprising a glass fiber substrate, a first patterned conductive layer, a second patterned conductive layer, at least one first via, at least one second via, and at least one third via, wherein the first patterned conductive layer and the second patterned conductive layer are respectively located on opposite sides of the glass fiber substrate, the at least one third via penetrates the glass fiber substrate and electrically connects the first patterned conductive layer and the at least one second via, the first patterned conductive layer is electrically connected to the first redistribution structure layer through the at least one first via, the second patterned conductive layer is electrically connected to the at least one first via through the at least one second via, and the conductive connecting members are connected to the second patterned conductive layer and are electrically connected to the first redistribution structure layer through the build-up structure layer.

6. The package carrier according to claim 1, wherein the at least one stiffener has a length, the molding compound has a thickness, and the length is less than or equal to the thickness.

7. The package carrier according to claim 1, wherein a material of the substrate of the connection structure layer comprises glass or silicon.

8. The package carrier according to claim 1, wherein a material of the at least one stiffener comprises steel, aluminum, copper, silicon, or glass.

9. The package carrier according to claim 1, wherein the at least one stiffener is a plurality of stiffeners, and the stiffeners are dispersedly arranged or arranged into a grid shape.

10. The package carrier according to claim 1, wherein the at least one stiffener is a continuous structure layer.

11. A manufacturing method of a package carrier, comprising:
    providing a substrate and a plurality of conductive bars, wherein the conductive bars are embedded in the substrate, and an end of each of the conductive bars is exposed to a side of the substrate;
    forming a first redistribution structure layer on the side of the substrate;
    forming a plurality of conductive connecting members and at least one stiffener on the first redistribution structure layer, wherein the at least one stiffener is located at least between the conductive connecting members;
    forming a molding compound on the first redistribution structure layer to cover the conductive connecting members and the at least one stiffener; and
    removing a portion of the substrate and a portion of the conductive bars to form a connection structure layer, wherein the connection structure layer comprises a substrate and a plurality of pads, and a top surface and a bottom surface of each of the pads are respectively exposed to an upper surface and a lower surface of the substrate.

12. The manufacturing method of the package carrier according to claim 11, further comprising:
    before forming the conductive connecting members and the at least one stiffener on the first redistribution structure layer, forming a second redistribution structure layer on the first redistribution structure layer, wherein a line width and a line spacing of the second redistribution structure layer are greater than a line width and a line spacing of the first redistribution structure layer.

13. The manufacturing method of the package carrier according to claim 11, wherein each of the conductive connecting members comprises a solder ball or a copper pillar.

14. The manufacturing method of the package carrier according to claim 11, wherein a material of the at least one stiffener comprises steel, aluminum, copper, silicon, or glass.

15. The manufacturing method of the package carrier according to claim 11, wherein the at least one stiffener has a length, the molding compound has a thickness, and the length is less than or equal to the thickness.

16. A chip package structure, comprising:
    a package carrier, comprising:

a first redistribution structure layer, having a first surface and a second surface opposite to each other;

a plurality of conductive connecting members, disposed on the first surface of the first redistribution structure layer and electrically connected to the first redistribution structure layer;

a connection structure layer, disposed on the second surface of the first redistribution structure layer and comprising a substrate and a plurality of pads, wherein a top surface and a bottom surface of each of the pads are respectively exposed to an upper surface and a lower surface of the substrate, and the pads are electrically connected to the first redistribution structure layer;

at least one stiffener, disposed on the first surface of the first redistribution structure layer and located at least between the conductive connecting members; and a molding compound, disposed on the first surface of the first redistribution structure layer and covering the conductive connecting members and the at least one stiffener; and at least one chip, disposed on the package carrier and electrically connected to the pads of the connection structure layer.

17. The chip package structure according to claim 16, further comprising:

a sealing material, disposed on the connection structure layer of the package carrier and covering a surrounding surface of at least one chip, wherein a back surface of the at least one chip is exposed to a surface of the sealing material.

18. The chip package structure according to claim 16, wherein the at least one chip is electrically connected to the pads through micro bump bonding or hybrid bonding.

19. The chip package structure according to claim 16, wherein the molding compound at least exposes a first bottom surface of each of the conductive connecting members.

20. The chip package structure according to claim 19, wherein the molding compound further exposes a second bottom surface of each of the at least one stiffener.

* * * * *